US012641746B2

(12) United States Patent
Tsorng et al.

(10) Patent No.: US 12,641,746 B2
(45) Date of Patent: May 26, 2026

(54) PRESSING INTRUSION-DETECTION MODULE FOR A COMPUTING STORAGE DEVICE

(71) Applicant: Quanta Computer Inc., Taoyuan City (TW)

(72) Inventors: Yaw-Tzorng Tsorng, Taoyuan City (TW); Ming-Lung Wang, Taoyuan City (TW); Jia-Lin Chen, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 165 days.

(21) Appl. No.: 18/399,420

(22) Filed: Dec. 28, 2023

(65) Prior Publication Data

US 2025/0220845 A1 Jul. 3, 2025

(51) Int. Cl.
*H05K 7/14* (2006.01)
(52) U.S. Cl.
CPC ......... *H05K 7/1495* (2013.01); *H05K 7/1487* (2013.01); *H05K 7/1489* (2013.01)
(58) Field of Classification Search
CPC .... H01H 13/14; H05K 1/0275; H05K 5/0208; H05K 7/1489; H05K 7/1495; H05K 7/1485; H05K 7/1487; H05K 7/1488; G06F 21/86; G06F 21/88; G06F 2221/2143; G06F 21/554; G08B 13/08; G08B 13/128; G08B 21/18; G08B 29/04; G08B 29/046; A47B 67/04; E05B 65/463; F25D 29/008; F25D 2700/02
See application file for complete search history.

(56) References Cited

U.S. PATENT DOCUMENTS

| | | | | | |
|---|---|---|---|---|---|
| 884,843 | A | * | 4/1908 | Newman | E05B 47/0002 109/47 |
| 2,955,282 | A | * | 10/1960 | Boyle | E05B 45/061 109/40 |
| 3,280,279 | A | * | 10/1966 | Walker | G08B 13/08 200/61.62 |
| 3,631,445 | A | * | 12/1971 | Shew | G08B 13/08 200/61.81 |
| 4,492,833 | A | * | 1/1985 | Malesko | H01H 1/32 200/530 |
| 4,707,684 | A | * | 11/1987 | Janke | F25D 29/008 62/131 |

(Continued)

*Primary Examiner* — Gage Crum
(74) *Attorney, Agent, or Firm* — NIXON PEABODY LLP

(57) ABSTRACT

A computing system includes a drawer configured to receive a plurality of computing storage devices. The drawer is movable between an open position and a plurality of closed positions. A printed circuit board (PCB) is mounted within the drawer in electronic communication with the plurality of computing devices. An intrusion-detection switch is attached to the PCB and is configured to detect movement of the drawer between the open position and the closed positions. A pressing module is attached to the movable drawer for extending an operating range of the intrusion-detection switch. The pressing module is in initial contact with the intrusion-detection switch when the drawer is in the initial closed position. The pressing module has a pressing unit that translates linearly in response to the drawer moving from an initial closed position to a maximum closed position.

20 Claims, 10 Drawing Sheets

(56)        References Cited

U.S. PATENT DOCUMENTS

| | | | | |
|---|---|---|---|---|
| 5,929,407 | A * | 7/1999 | Ziem | H01H 3/166 |
| | | | | 200/345 |
| 6,023,887 | A * | 2/2000 | Okubo | H01H 9/226 |
| | | | | 200/61.69 |
| 6,084,511 | A * | 7/2000 | Kil | G08B 13/08 |
| | | | | 340/545.9 |
| 7,170,403 | B2 * | 1/2007 | Noguchi | G08B 29/046 |
| | | | | 340/568.1 |
| 9,696,084 | B1 * | 7/2017 | Kalva | F25D 23/025 |
| 9,763,362 | B1 * | 9/2017 | Xu | G11B 33/142 |
| 10,111,323 | B2 * | 10/2018 | Tseng | H05K 1/0275 |
| 11,429,755 | B2 * | 8/2022 | Westphall | G06F 1/182 |
| 2006/0049941 | A1 * | 3/2006 | Hunter | G08B 13/08 |
| | | | | 340/545.6 |
| 2013/0321162 | A1 * | 12/2013 | Kohler | G06F 1/181 |
| | | | | 340/686.1 |
| 2014/0268559 | A1 * | 9/2014 | Vega | H05K 5/0208 |
| | | | | 361/752 |
| 2018/0061593 | A1 * | 3/2018 | Poon | H03K 17/965 |
| 2019/0251299 | A1 * | 8/2019 | Kannler | G06F 21/86 |
| 2021/0407280 | A1 * | 12/2021 | Hoofe, IV | G08B 25/016 |
| 2023/0052840 | A1 * | 2/2023 | Higby | H01L 23/04 |

* cited by examiner

PRESSING INTRUSION-DETECTION MODULE FOR A COMPUTING STORAGE DEVICE

FIELD OF THE INVENTION

The present invention relates generally to computing systems, and more specifically, to detection of intrusion for computing storage devices.

BACKGROUND OF THE INVENTION

IT systems generally require data centers that accommodate a mass number of data storage devices, including server systems. Maintenance and replacement of components in these devices are performed in respective housing racks. For example, drawer-based data storage devices require opening drawers when performing device maintenance and hard disk drive ("HDD") replacement.

Typically, the data storage devices include intrusion-detection switches on the drawers. These switches detect and record when the drawer is opened or closed. However, based on the complexity of drawer assembly, a problem with current devices is that assembly tolerance of a drawer may exceed an effective operating range of the intrusion-detection switch. Thus, the intrusion-detection switch becomes ineffective after initial assembly.

Yet another problem occurs during usage or transportation of the data storage devices. Collisions between the intrusion-detection switch and drawer features may result in false triggering or damage of the intrusion-detection switch. The present disclosure provides a solution for these and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a computing system includes a drawer configured to receive a plurality of computing storage devices. The drawer is movable between an open position and a plurality of closed positions. The plurality of closed positions includes an initial closed position and a maximum closed position. The computing system further includes a printed circuit board (PCB) mounted within the drawer. The PCB is in electronic communication with the plurality of computing devices. The computing system further includes an intrusion-detection switch attached to the PCB. The intrusion-detection switch is configured to detect movement of the drawer between the open position and the plurality of closed positions. The computing system further includes a pressing module that is attached to the movable drawer for extending an operating range of the intrusion-detection switch. The pressing module is in initial contact with the intrusion-detection switch when the drawer is in the initial closed position. The pressing module has a pressing unit that translates linearly in response to the drawer moving from the initial closed position to the maximum closed position.

According to certain aspects of the computing system described above, the pressing unit is in contact with intrusion-detection switch as the drawer moves between the initial closed position and the maximum closed position.

According to some aspects of the computing system described above, the drawer travels linearly a predetermined tolerance distance between the initial closed position and the maximum closed position.

According to other aspects of the computing system described above, the predetermined tolerance distance corresponds to a pressing distance of the pressing unit.

According to other aspects of the computing system described above, the drawer is movable in response to a user force during a maintenance operation.

According to other aspects of the computing system described above, at least one of the plurality of computing storage devices is a server.

According to other aspects of the computing system described above, the pressing module includes a spring that exerts a force on the pressing unit.

According to other aspects of the computing system described above, the force of the spring is opposite in direction relative to movement of the drawer toward the plurality of closed positions.

According to other aspects of the computing system described above, the spring is a compression spring.

According to other aspects of the computing system described above, the pressing module includes a main base that is fixedly attached to the movable drawer and to the pressing unit. The compression spring is mounted within the pressing unit.

According to other aspects of the computing system described above, the pressing unit includes a secondary base and a cover. The compression spring is mounted between the secondary base and the cover.

According to other aspects of the computing system described above, the cover has a spring-receiving internal space for receiving within the compression spring.

According to other aspects of the computing system described above, the secondary base has a base shaft configured for making direct contact with the compression spring.

According to other aspects of the computing system described above, the compression spring has one end in contact with the cover and one end in contact with the secondary base.

According to other aspects of the present disclosure, a computing system includes a drawer movable between an open position and a closed position. The computing system further includes an intrusion-detection switch configured to detect movement of the drawer between the open position and the closed position. The computing system further includes a pressing module mounted within to the drawer. The pressing module includes a main base fixed to the drawer, and a pressing unit attached to the main base. The pressing unit has a first end fixedly attached to the main base. The pressing unit further has a second end free to translate linearly relative to the main base. The pressing unit further has a compression spring mounted between the first end and the second end for facilitating linear translation of the pressing unit. The pressing unit is in contact with the intrusion-detection switch when the drawer is in the closed position. The pressing unit translates linearly in response to movement of the drawer in the closed position along a predetermined tolerance distance.

According to certain aspects of the computing system described above, the pressing unit further has a secondary base fixedly coupled to the main base. The secondary base forms the first end.

According to other aspects of the computing system described above, the pressing unit further has a cover movingly coupled to the secondary base. The cover forms the second end, and the compression spring is mounted internal to the cover and overlapping a portion of the secondary base.

According to yet other aspects of the present disclosure, a method is directed to detecting intrusion in a computing system. The method includes providing a drawer for receiving a plurality of computing storage devices. The method further includes configuring the drawer for movement between an open position and a closed position. The method further includes detecting movement of the drawer via physical contact between an intrusion-detection switch and a pressing module. The physical contact occurs in an initial contact position and continues through a maximum contact position. The method further includes, in response to the physical contact, translating linearly a pressing unit of the pressing module along a predetermined tolerance distance of the drawer in the closed position. The predetermined tolerance distance is a maximum operating range of the drawer that is defined by the initial contact position and the maximum contact position.

According to certain aspects of the method described above, the method further includes moving the drawer in response to a user force during a maintenance operation.

According to other aspects of the method described above, the method further includes exerting a spring compression force on the pressing unit. The spring compression force is opposite in direction to movement of the drawer towards the closed position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
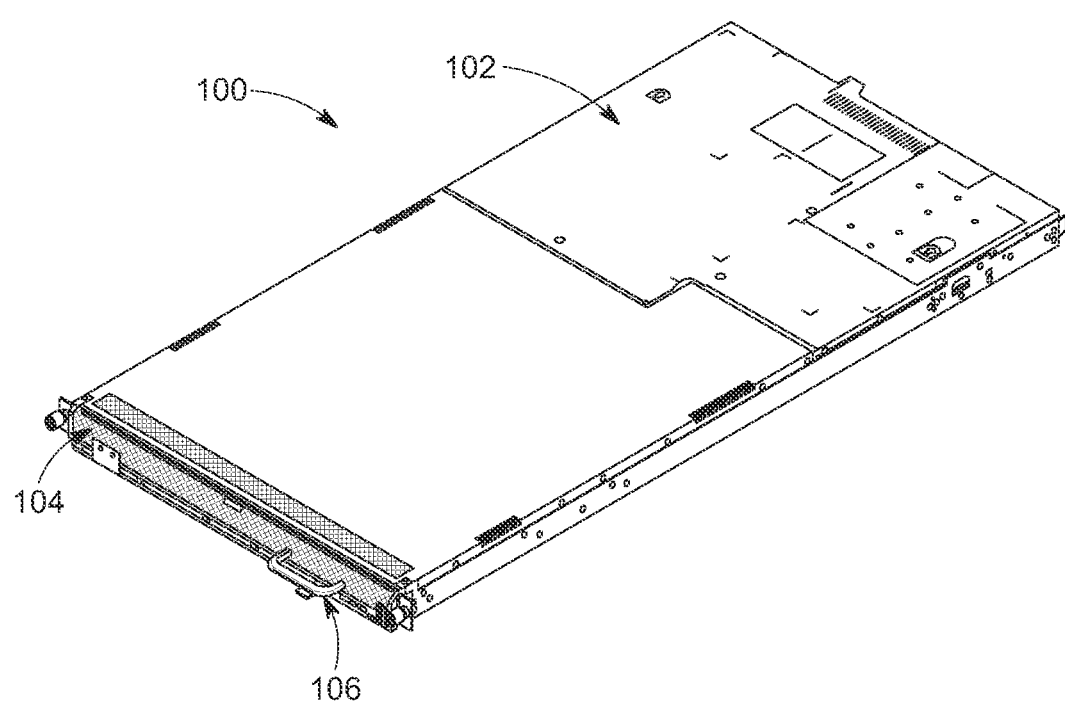
FIG. 1 is a perspective view of a data storage device, in accordance with aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including"

means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a computing system 100 is illustrated in the form of a server. The computing system 100 has a chassis 102 in which a drawer 104 is housed. The drawer 104 has a handle 106 that facilitates opening and closing of the drawer 104 relative to the chassis 102. In FIG. 1, the drawer 104 is in a closed position.

Figure 2:
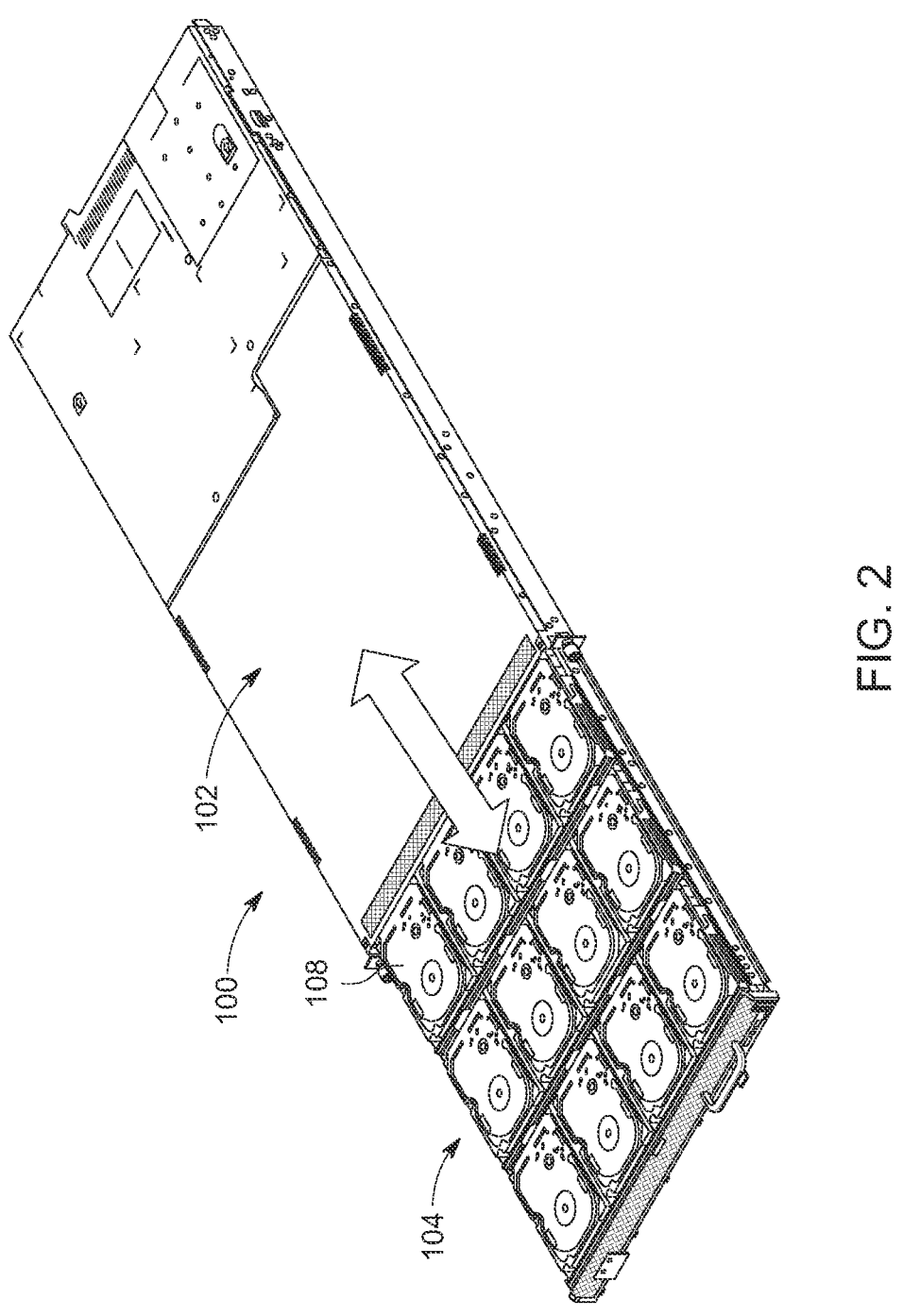
FIG. 2 is a perspective view illustrating the data storage device of FIG. 1 with an open drawer, in accordance with other aspects of the present disclosure.

Referring to FIG. 2, the drawer 104 is in an open position relative to the chassis 102 of the computing system 100. The drawer 104 has mounted within a plurality of computing storage devices 108. One, some, or all of the computing storage devices 108 include an HDD, solid state drive (SSD), or other computing component. The computing storage devices 108 are optionally arranged in array form, along respective rows and columns (e.g., 12 computing storage devices 108 in 3 rows×4 columns). Different numbers of drawers may be installed in the computing system 100. The number of computing storage devices in a drawer may be more or less than the example of 12 computing storage devices illustrated in FIG. 2.

Figure 3:
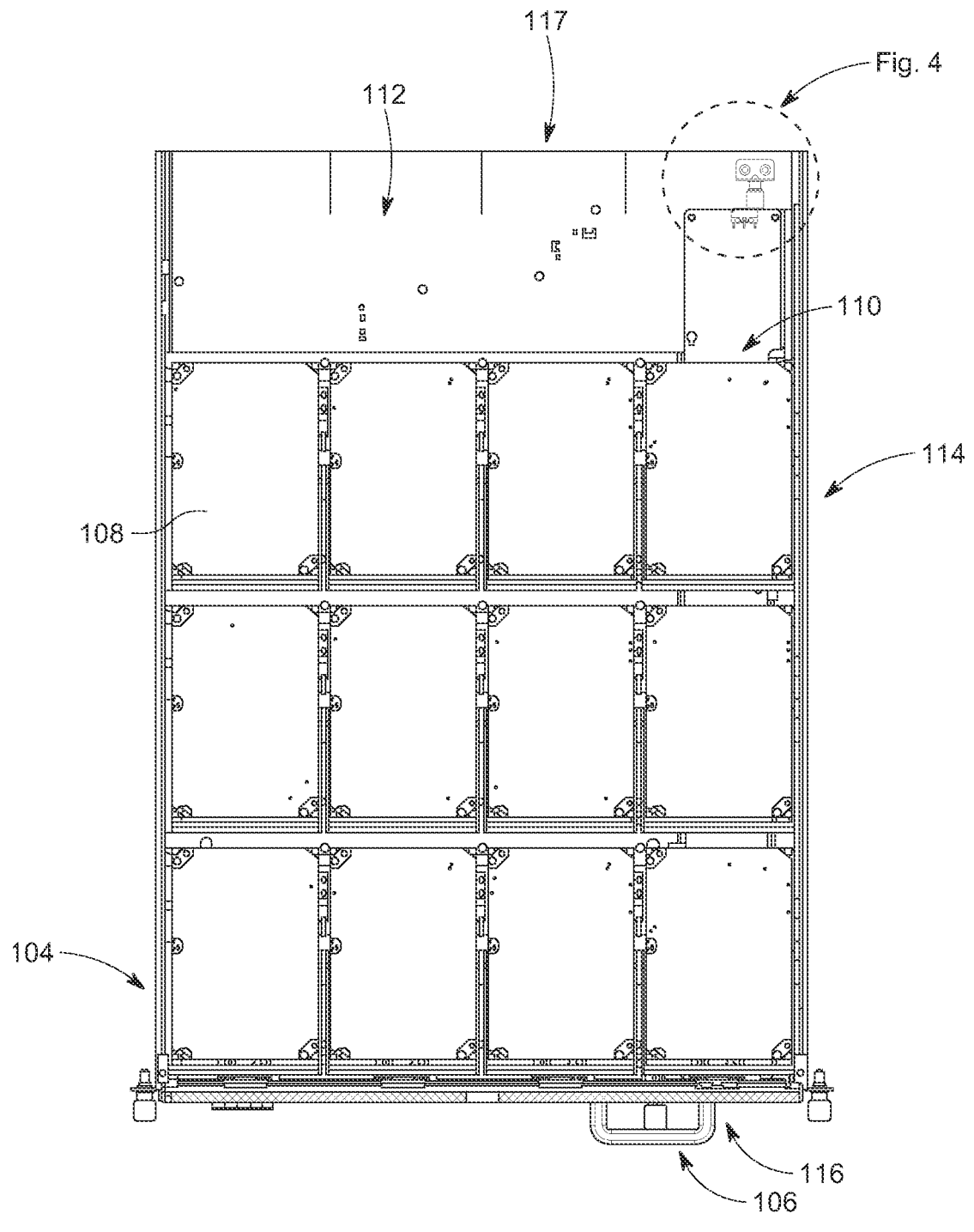
FIG. 3 is a top view illustrating internal components of the drawer shown in FIG. 2, in accordance with other aspects of the present disclosure.

Referring to FIG. 3, the computing storage devices 108 are in electronic communication with a printed circuit board ("PCB") 110. The PCB 110 is fixed along a bottom surface 112 of the drawer 104, for example, along a right side 114 of the drawer 104. Optionally, the PCB 110 extends from (or near) a front side 116 of the drawer 104 to (or near) a back side 117 of the drawer 104.

The handle 106 is mounted on the front side 116 of the drawer 104. When maintenance or other technical intervention is required, a user grabs the handle 106 to open or close the drawer 104. As such, the drawer 104 is movable in response to a user force during a maintenance or other operations.

Figure 4:
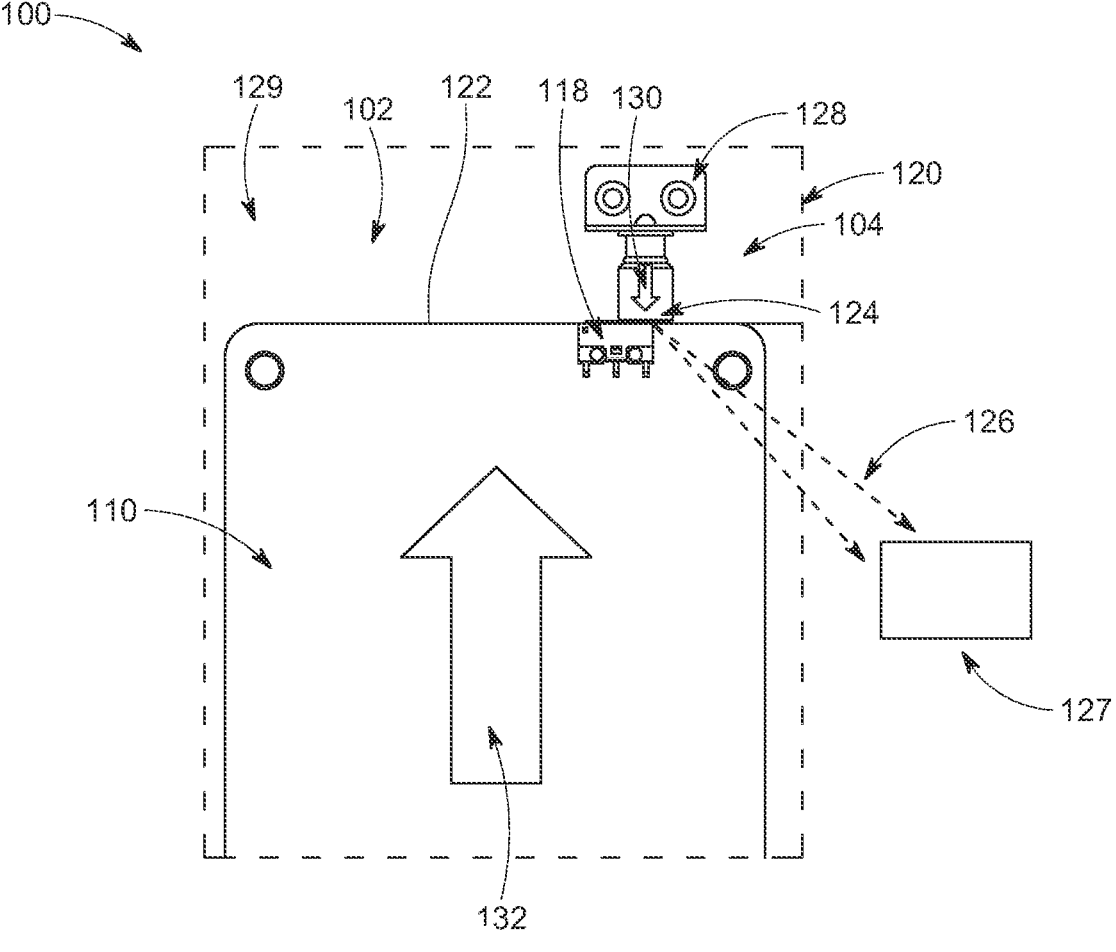
FIG. 4 is a top enlarged view illustrating interaction between an intrusion-detection switch and a pressing module of the drawer shown in FIG. 3, in accordance with other aspects of the present disclosure.

Referring to FIG. 4, an intrusion-detection switch 118 is mounted in a rear area 120 of the drawer 104. For example, in the illustrated embodiment, the intrusion-detection switch 118 is mounted along a rear edge 122 of the PCB 110. The intrusion-detection switch 118 has a movable sensor 124 that produces one or more signals 126 indicative of an applicable position of the drawer 104. The signals 126 are communicated in electrical or electronic form to a controller 127 for recordation or further action purposes. As such, the intrusion-detection switch 118 is configured to detect movement of the drawer 104 between positions, including the open position and the closed position.

A pressing module 128 is mounted to the chassis 102 in a rear area 129 of the chassis 102. More specifically, the pressing module 128 is mounted such that it is in proximity to, and makes contact with, the intrusion-detection switch 118 when the drawer 104 is in the closed position.

The pressing module 128 is beneficial for many reasons, including using spring characteristics to increase an effective range of the intrusion-detection switch 118, as disclosed below in more detail. In another beneficial example, the pressing module 128 absorbs impact forces during usage or transportation of the drawer 104, thereby enhancing durability and stability of the intrusion-detection switch 118. In yet another beneficial example, the pressing module 128 prevents occurrences of over-compression or failure to trigger the intrusion-detection switch 118.

Based on the relatively close positioning of the intrusion-detection switch 118 and the pressing module 128, the signal 126 indicates when the drawer 104 is in the closed position and when the drawer 104 is in the open position. For example, if the intrusion-detection switch 118 is not in contact with the pressing module 128, the signal 126 is indicative of the open position. Instead, by way of example, if the intrusion-detection switch 118 is in contact with the pressing module 128, the signal 126 is indicative of the closed position.

The pressing module 128 operates with a translational linear force 130 that is opposite to a user force 132, which presses the drawer 104 into the closed position. Thus, the translational linear force 130 is opposite in direction relative to movement of the drawer 104 toward the closed position. As further disclosed below, the pressing module 128 provides a predetermined tolerance distance along which the drawer 104 is movable while in the closed position. Consequently, damage to the computing system 100 or unintended false alarms are reduced or prevented.

Based on the signal 126, recorded positions of the drawer 104 are provided to the controller 127. The recorded positions may include additional metadata correlated with the signal 126, such as the time the signal 126 is provided and the operation of the storage device 108. This information provides insight into why and when the computing storage devices 108 may have been accessed. In turn, security or other concerns related to the computing storage devices 108 may be properly addressed by analyzing the metadata.

Figure 5:
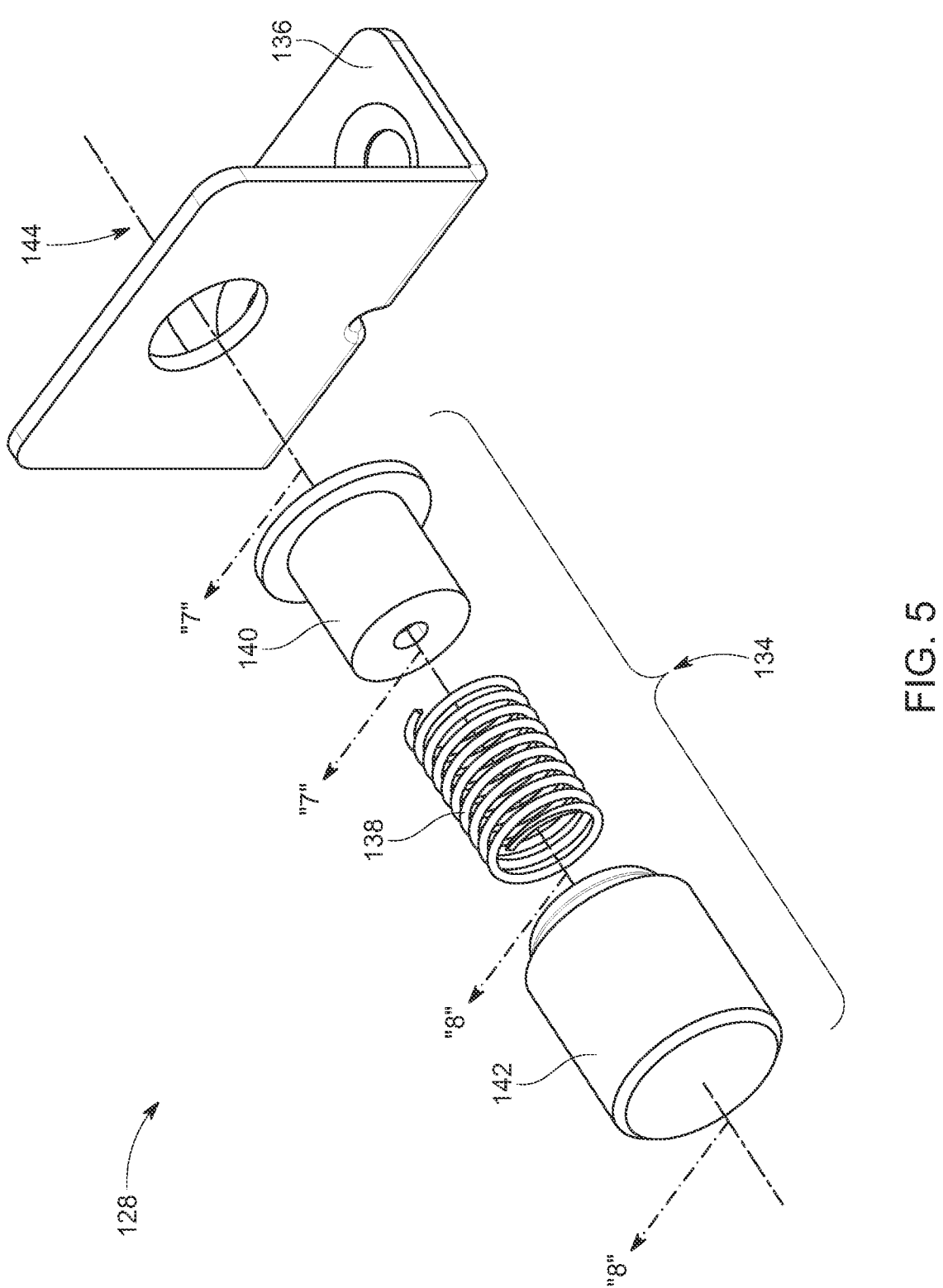
FIG. 5 is an exploded perspective view illustrating the pressing module of FIG. 4, in accordance with other aspects of the present disclosure.

Referring to FIG. 5, the pressing module 128 includes a pressing unit 134 that is attached to a main base 136. The pressing unit 134 includes a spring 138, a secondary base 140, and a cover 142. The spring 138 is generally mounted between the secondary base 140 and the cover 142. The spring 138 is concentric with the secondary base 140 and the cover 142, along a central axis 144.

According to an exemplary embodiment, the pressing unit 134 is fabricated in whole or in part from a material that is metal or plastic. The material for the pressing unit 134 is selected to prevent abrasion, cracking, and distortion after loading into the drawer 104.

Figure 6:
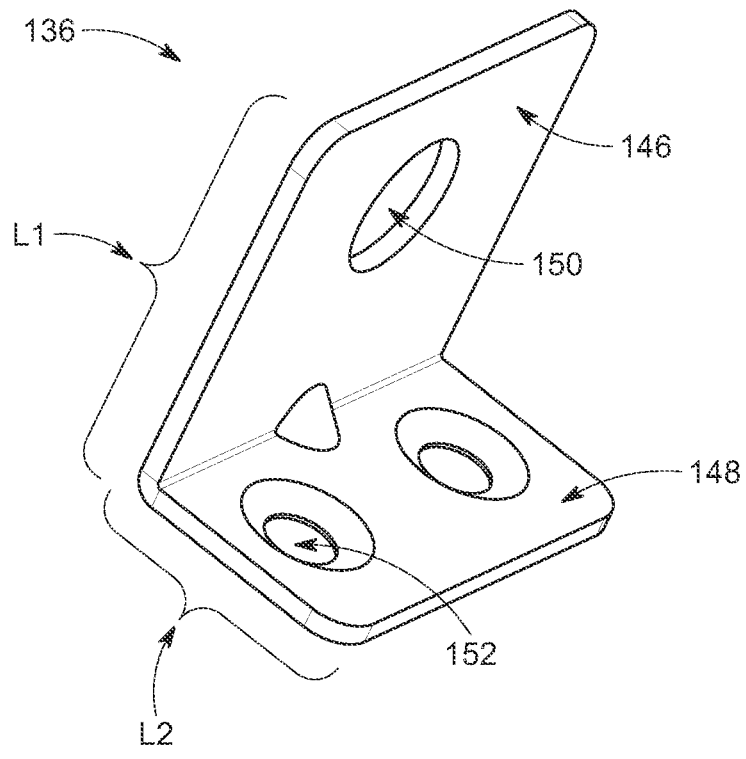
FIG. 6 is a perspective view of a main base of the pressing module of FIG. 5, in accordance with other aspects of the present disclosure.

Referring to FIG. 6, the main base 136 has a generally L-shape, which includes a unit wall 146 connected generally perpendicular to a chassis wall 148. The unit wall 146 has a unit hole 150 for receiving within a portion of the secondary base 140 (as described in more detail below). The chassis wall 148 has a plurality of chassis holes 152 for fixedly mounting the main base 136 to the chassis 102 (as shown, for example, in FIGS. 3, 4, and 14), via respective fasteners (e.g., screws, bolts, etc.).

According to one example, the unit wall 146 has a length L1 that is much greater than a length L2 of the chassis wall 148. For example, the length L1 is more than twice the length L2.

According to another example, the chassis wall 148 is mounted generally horizontally. Correspondingly, the unit wall 146 is positioned generally vertically.

According to an exemplary embodiment, the main base 136 is fabricated in whole or in part from a material that is metal or plastic. The material for the main base 136 is selected to prevent abrasion, cracking, and distortion after loading into the drawer 104.

Figure 7:
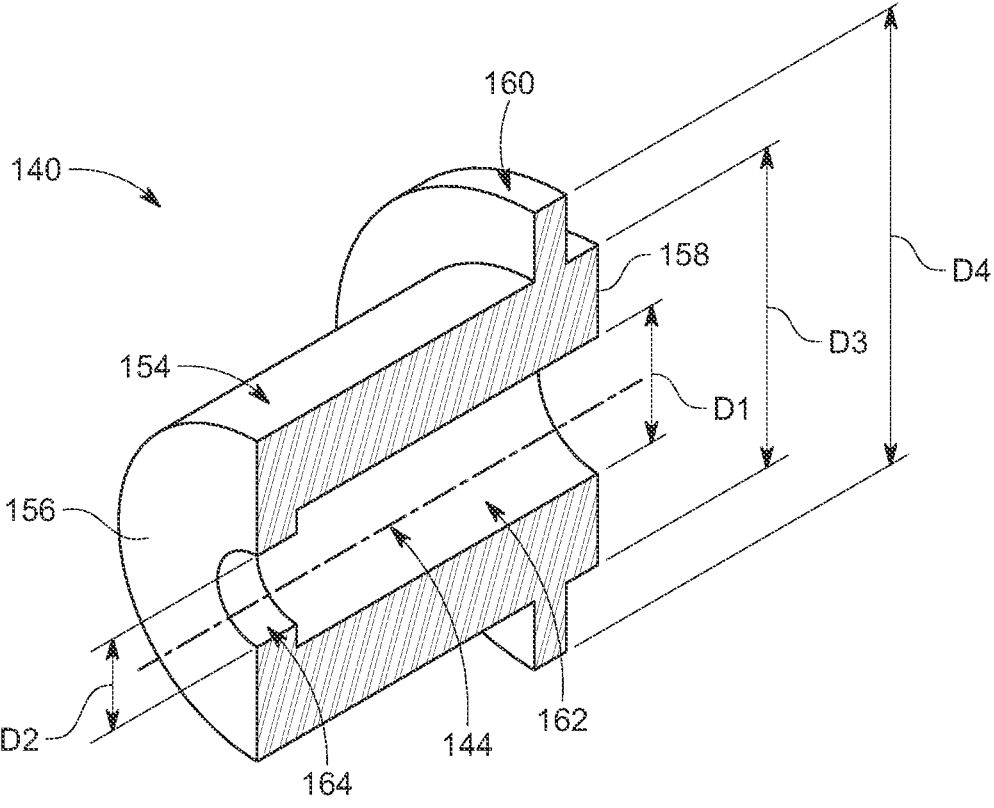
FIG. 7 is a cross-sectional view illustrating a secondary base along lines "7-7" of FIG. 5, in accordance with other aspects of the present disclosure.
Figure 11:
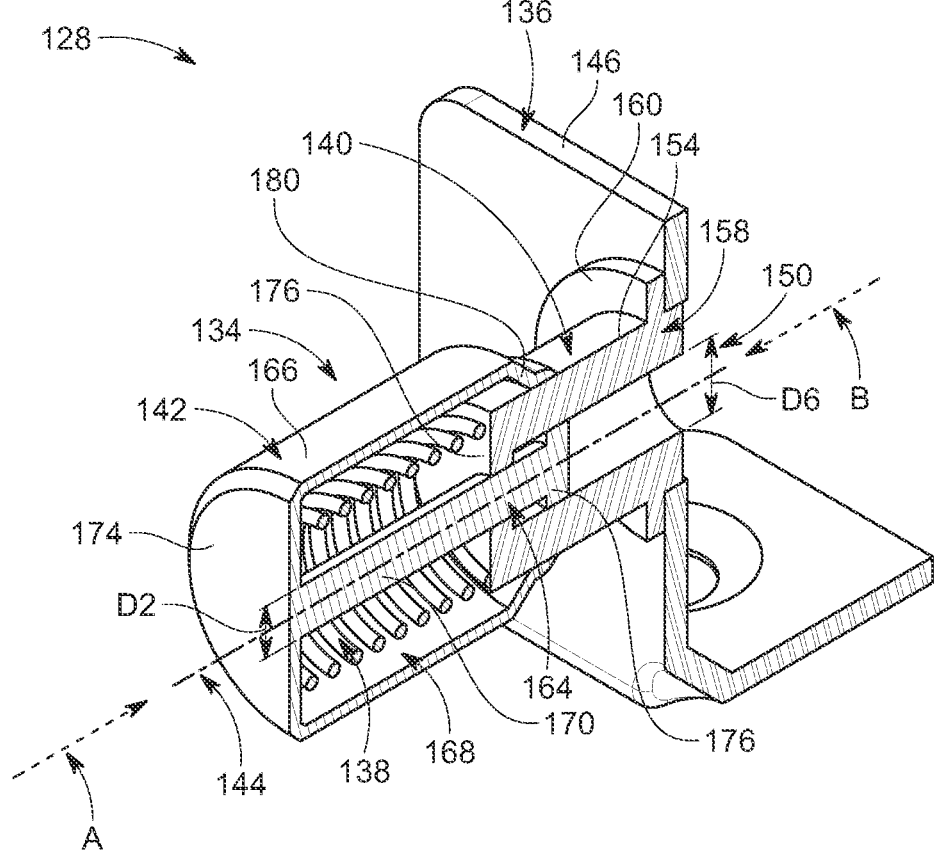
FIG. 11 is a cross-sectional view illustrating the pressing module along lines "11-11" of FIG. 10, in accordance with other aspects of the present disclosure.

Referring to FIG. 7, the secondary base 140 has a base shaft 154 that is configured for making direct contact with the spring 138 (as shown, for example, in FIG. 11). More specifically, the base shaft 154 has a spring end 156 and a base end 158. Near the base end 158, the secondary base 140 has a base wall 160. The base end 158 extends past the base wall 160.

The secondary base 140 further has a base hole 162, which extends throughout most of the secondary base 140 along the central axis 144. The base hole 162 has generally a uniform diameter D1 along the central axis 144.

At the spring end 156, the secondary base 140 further has a cover hole 164. The cover hole 164 has a diameter D2, which is smaller than diameter D1 of the base hole 162. Both hole diameters D1 and D2 are smaller than a diameter D3 of the base shaft 154, which is smaller than a diameter D4 of the base wall 160. The cover hole 164 is configured to receive within and mount to the cover 142 (as shown, for example, in FIG. 11).

According to an exemplary embodiment, the secondary base 140 includes in whole or in part a material that is metal or plastic. The material for the secondary base 140 is configured to prevent abrasion, cracking, and distortion after loading into the drawer 104.

Figure 8:
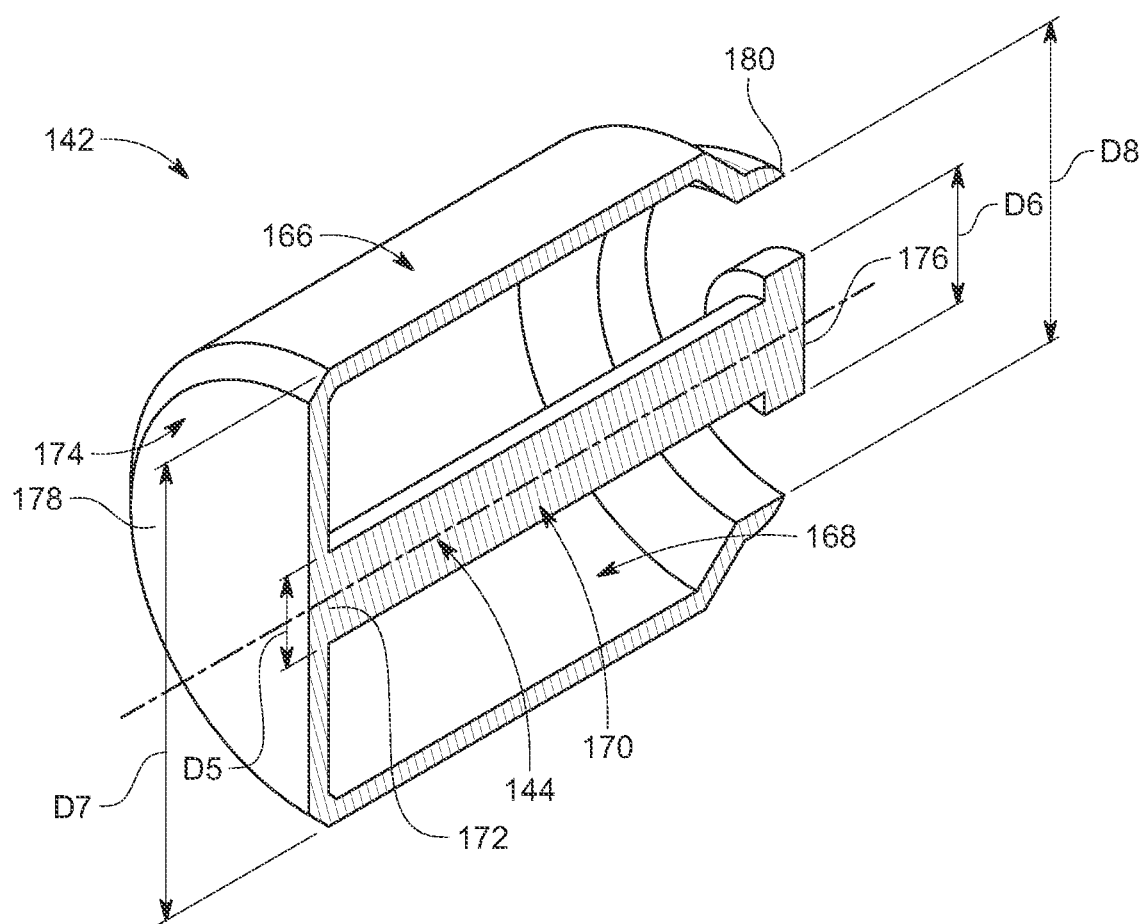
FIG. 8 is a cross-sectional view illustrating a cover along lines "8-8" of FIG. 5, in accordance with other aspects of the present disclosure.

Referring to FIG. 8, the cover 142 has a peripheral wall 166, which is generally cylindrical and coincident with the central axis 144. The peripheral wall 166 encloses a spring-receiving internal space 168 in which a cover shaft 170 extends along the central axis 144.

The cover shaft 170 extends from the cover face 174 in cantilever manner, having a fixed end 172 attached to a cover face 174. The cover shaft 170 extends from the fixed end 172 to a free end 176, along the central axis 144. The fixed end 172 has a smaller diameter D5 than a diameter D6 of the free end 176. According to one example, most of the length of the cover shaft 170 has the same diameter as the diameter D5 of the fixed end 172.

Figure 14:
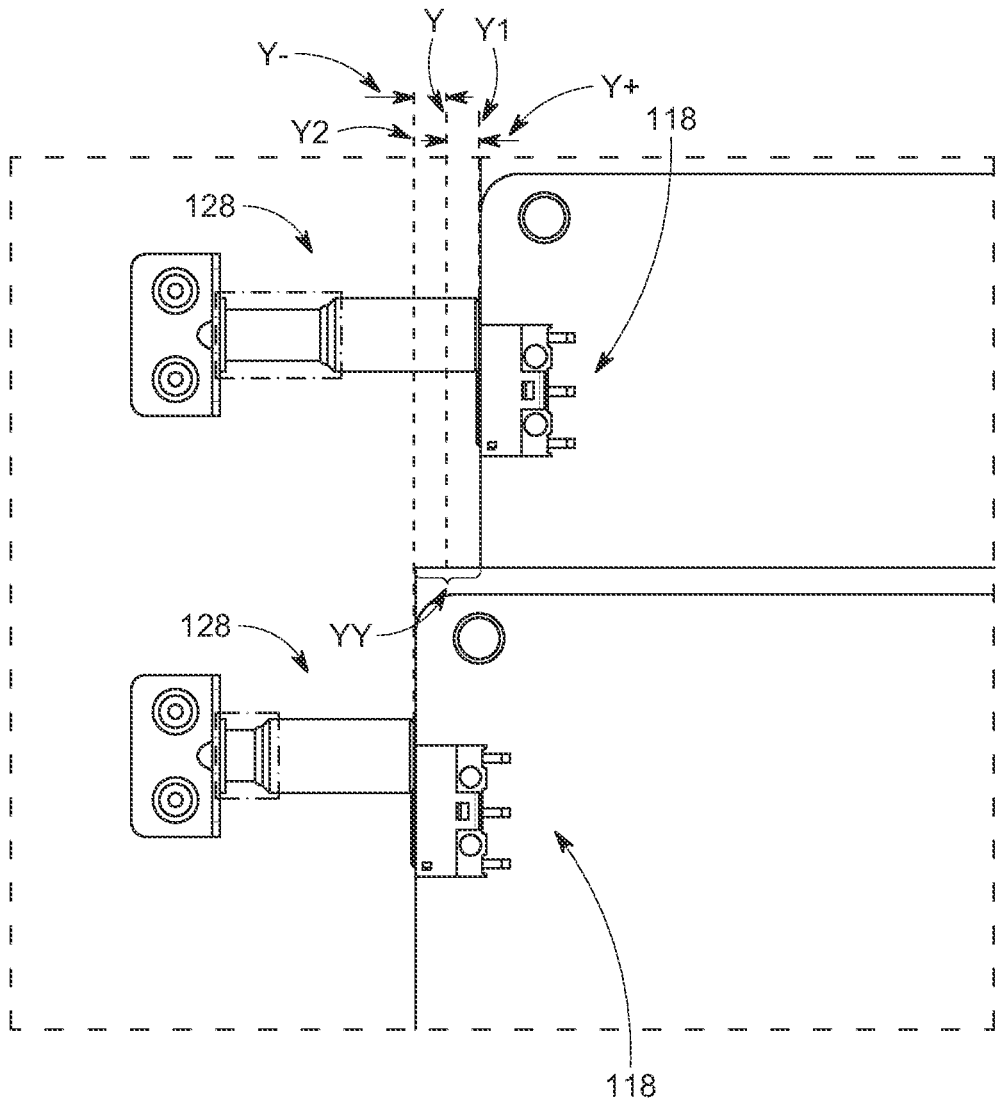
FIG. 14 is a top view representing a linear translation of the pressing module of FIG. 5 in response to physical contact with the intrusion-detection switch of FIG. 4, in accordance with other aspects of the present disclosure.

The cover face 174 has a contact surface 178, which is configured to make contact with the intrusion-detection switch 118 (as shown, for example, in FIG. 14). The cover face 174 generally encloses the spring-receiving internal space 168 in a perpendicular plane relative to the central axis 144.

The peripheral wall 166 has a diameter D7, which is generally uniform and extends between the cover face 174 and a coupling end 180. The coupling end 180 has a diameter D8, which is smaller than diameter D7 of the peripheral wall 166. The diameter D8 of the coupling end 180 is slightly larger than the diameter D3 of the shaft 154. As such (as shown, for example, in FIGS. 12 and 13), the relative size of the diameters D8 and D3 facilitate linear translation of the cover 142 relative to the secondary base 140. The linear translation is further described in more detail below.

According to an exemplary embodiment, the cover 142 is fabricate in whole or in part from a material that is metal or plastic. The material for the cover 142 is selected to prevent abrasion, cracking, and distortion after loading into the drawer 104.

Figure 9:
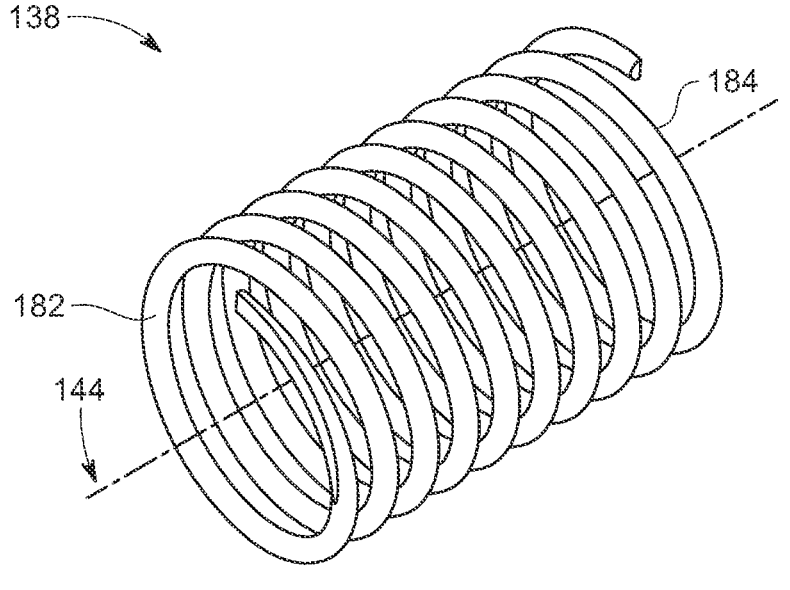
FIG. 9 is a perspective of a spring of the pressing module of FIG. 5, in accordance with other aspects of the present disclosure.

Referring to FIG. 9, the spring 138 is generally, according to one example, a compression spring. The spring 138 has a first end 182, which is configured to make contact with the cover face 174 (as shown, for example, in FIG. 11), and a second end 184, which is configured to make contact with the spring end 156 of the shaft 154 (as also shown, for example, in FIG. 11).

According to an exemplary embodiment, the spring 138 is fabricated in whole or in part from a material that is metal or plastic. The material for the spring 138 is selected to prevent abrasion, cracking, and distortion after loading into the drawer 104.

Figure 10:
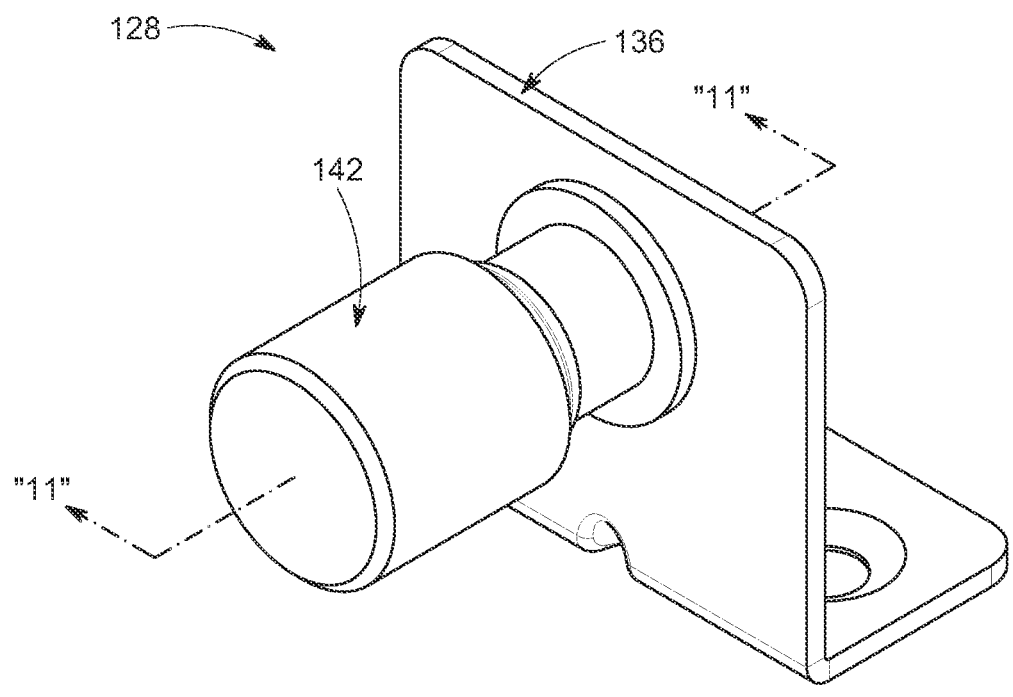
FIG. 10 is an assembled perspective view illustrating the pressing module of FIG. 5, in accordance with other aspects of the present disclosure.

Referring generally to FIGS. 10 and 11, the pressing module 128 is configured to facilitate linear translation of the cover 142 relative to the main base 136. Referring more specifically to FIG. 11, the pressing unit 134 is mounted to the main base 136. Specifically, the base end 158 of the secondary base 140 is mounted within the unit hole 150 of the main base 136. According to one example, the base end 158 is configured for mounting with the unit hole 150 via a press-fit attachment.

The base wall 160 of the secondary base 140 is in direct contact with the unit wall 146 of the main base 136. As such, the base wall 160 prevents movement of the secondary base 140 relative to the main base 136 along the central axis 144.

The cover 142 is movingly coupled with the secondary base 140. More specifically, the free end 176 of the cover 142 is mounted within the cover hole 164 of the secondary base 140. The free end 176 is free to translate linearly, along the central axis 144, within the cover hole 164.

Additionally, the coupling end 180 of the cover 142 also translates linearly, parallel to the central axis 144, over the base shaft 154. In other words, as the coupling end 180 glides externally over the base shaft 154, the free end 176 slides internally within the cover hole 164.

Movement of the cover 142 relative to the secondary base 140 is limited by the mounting configuration. When the cover 142 moves in a direction A towards the main base 136, the movement is limited by eventual contact between the coupling end 180 of the cover 142 and the base wall 160 of the secondary base 140. When the cover 142 moves in a direction B away from the main base 136, the movement is limited by eventual contact between the free end 176 (with larger diameter D6) and the cover hole 164 (with smaller diameter D2). Thus, the configuration of the pressing module 128 prevents inadvertent decoupling of the cover 142 from the secondary base 140.

The spring 138 provides flexible, controlled movement between the cover 142 and the secondary base 140. The spring 138 is inserted in the spring-receiving internal space 168, between the cover 142 and the secondary base 140. The spring 138 is fixed along the central axis 144 between the cover face 174 and the spring end 156. The spring 138 is further fixed laterally relative to the central axis 144 between the cover shaft 170 and the peripheral wall 166. The cover shaft 170 is inserted through the spring 138, providing a travel guide along the central axis 144. As the cover 142 moves in direction A, the spring 138 compresses, providing a resisting force in the direction B. As the cover 142 moves in direction B, the spring 138 expands, providing a return force in the direction A.

Figure 12:
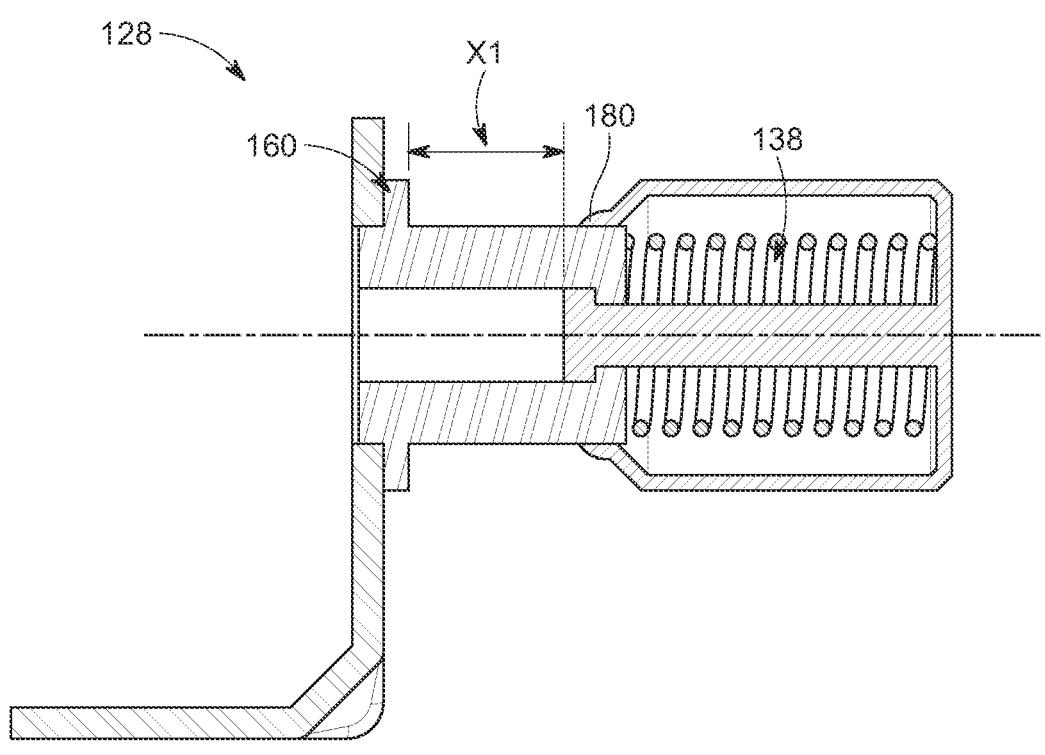
FIG. 12 is a cross-sectional view along lines "5-5" of FIG. 5, representing the pressing module in a release state, in accordance with other aspects of the present disclosure.
Figure 13:
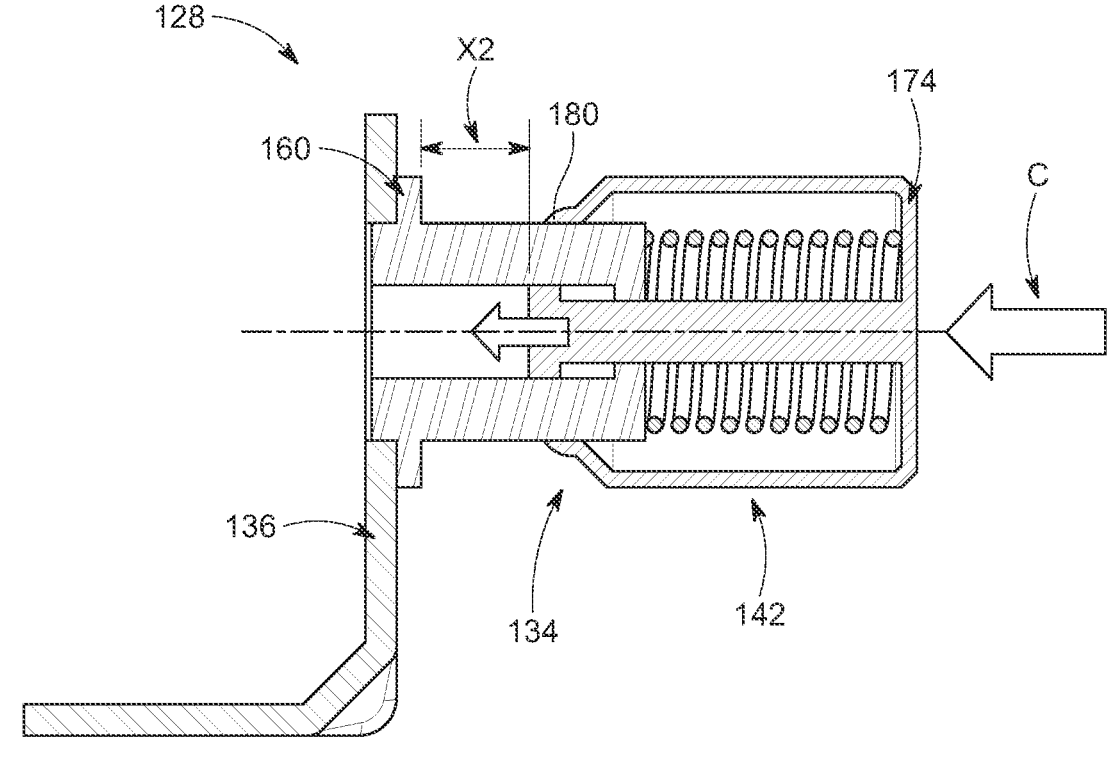
FIG. 13 is a cross-sectional view along lines "5-5" of FIG. 5, representing the pressing module in a working state, in accordance with other aspects of the present disclosure.

Referring generally to FIGS. 12 and 13, linear translation of the pressing module 128 is illustrated between a release state (FIG. 12) and a working state (FIG. 13). Referring specifically to FIG. 12, the pressing module 128 is in the release state in which the coupling end 180 is at a maximum distance X1 from the base wall 160. In the release state, the spring 138 is generally uncompressed.

Referring now specifically to FIG. 13, the pressing module 128 is in the working state in which a force C is applied by the intrusion-detection switch 118 to the pressing unit 134. More specifically, the force C makes direct contact with the cover face 174, pressing the cover 142 towards the main base 136. As the cover 142 moves, the coupling end 180 is now at a smaller distance X2 from the base wall 160. Optionally, the coupling end 180 eventually makes contact with and stops at the base wall 160, if the force C continues to press the cover 142.

As the force C continues to press the cover 142, the spring 138 is compressed, generally absorbing energy and preventing the intrusion-detection switch 118 from being over-pressed or subjected to undesirable shock forces during movement of the drawer 104.

Referring to FIG. 14, the pressing module 128 is configured to extend the operating range of the intrusion-detection switch 118. According to one example, the operating range extends plus/minus from a default position Y. In the default position Y, the pressing module 128 is slightly compressed, allowing the pressing module 128 to expand or contract as applicable.

For example, if a gap +Y between the pressing module 128 and the intrusion-detection switch 118 is too large (as illustrated in the top portion of FIG. 14), the pressing module 128 expands to cover the gap +Y. Thus, contact between the pressing module 128 and the intrusion-detection switch 118 is properly maintained. The large gap +Y may be, for example, a result of under-compression caused by manufacturing misalignments or other factors.

However, if a gap −Y between the pressing module 128 and the intrusion-detection switch 118 is too small (as illustrated in the bottom portion of FIG. 14), the pressing module 128 compresses to account for the gap −Y. Thus, again, contact between the pressing module 128 and the intrusion-detection switch is properly maintained. The small gap −Y may be, for example, a result of over-compression caused by sudden impact forces (such as those caused during transportation or improper maintenance operations).

In another example of over-compression, the pressing module 128 is in initial contact with the intrusion-detection switch 118 when the drawer 104 is in an initial closed position at a minimum position Y1. However, based on various factors (such as unintended collisions during transportation), the pressing unit 134 translates linearly in response to the drawer 104 moving from the initial closed position at the minimum position Y1 to a maximum closed position at Y2. The pressing unit 134 maintains contact with the intrusion-detection switch 118 between the initial closed position at Y1 and the maximum closed position at Y2. As such, the pressing module 128 extends an operating range of the intrusion-detection switch 118 for a predetermined tolerance distance YY.

In the above example, the movement of the pressing unit 134 has been disclosed in accordance with at least two closed positions: the initial closed position and the maximum closed position. In other examples, the movement of the pressing unit 134 is further disclosed in reference to a single closed position in which the pressing unit 134 translates linearly in response to movement of the drawer 104 along the predetermined tolerance distance YY. In other words, the movement of the pressing unit 134 provides a linear translation if collisions, movements, or other tolerance-related aspects require flexibility in movement of the drawer 104.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
    a chassis;
    a drawer housed and insertable within the chassis, the drawer being configured to receive a plurality of computing storage devices, the drawer being movable relative to the chassis between an open position and a plurality of closed positions, the plurality of closed positions including an initial closed position and a maximum closed position, the drawer being partially inserted within the chassis in the open position, the drawer being fully inserted within the chassis in at least one of the plurality of closed positions;
    a printed circuit board (PCB) mounted within the drawer, the PCB being in electronic communication with the plurality of computing storage devices;
    an intrusion-detection switch attached to the PCB and mounted in a rear area of the drawer, the intrusion-detection switch being configured to detect movement of the drawer between the open position and the plurality of closed positions; and
    a pressing module attached to the chassis for extending an operating range of the intrusion-detection switch, the pressing module being mounted to the chassis rearwardly of the rear area of the drawer, the pressing module being in initial contact with the intrusion-detection switch when the drawer is in the initial closed position, the pressing module having a pressing unit that translates linearly in response to the drawer moving from the initial closed position to the maximum closed position.

2. The computing system of claim 1, wherein the pressing unit is in contact with the intrusion-detection switch as the drawer moves between the initial closed position and the maximum closed position.

3. The computing system of claim 1, wherein the drawer travels linearly a predetermined tolerance distance between the initial closed position and the maximum closed position.

4. The computing system of claim 3, wherein the predetermined tolerance distance corresponds to a pressing distance of the pressing unit.

5. The computing system of claim 1, wherein the drawer is movable in response to a user force during a maintenance operation.

6. The computing system of claim 1, wherein at least one of the plurality of computing storage devices is a server component.

7. The computing system of claim 1, wherein the pressing module includes a spring that exerts a force on the pressing unit.

8. The computing system of claim 7, wherein the force of the spring is opposite in direction relative to movement of the drawer toward the plurality of closed positions.

9. The computing system of claim 7, wherein the spring is a compression spring.

10. The computing system of claim 9, wherein the pressing module includes a main base that is fixedly attached to the chassis and to the pressing unit, the compression spring being mounted within the pressing unit.

11. The computing system of claim 10, wherein the pressing unit includes a secondary base and a cover, the compression spring being mounted between the secondary base and the cover.

12. The computing system of claim 11, wherein the cover has a spring-receiving internal space for receiving the compression spring.

13. The computing system of claim 12, wherein the secondary base has a base shaft configured for making direct contact with the compression spring.

14. The computing system of claim 13, wherein the compression spring has one end in contact with the cover and one end in contact with the secondary base.

15. A computing system comprising:

a chassis;

a drawer housed within the chassis and movable between an open position and a closed position, the drawer being partially inserted within the chassis in the open position, the drawer being fully inserted within the chassis in the closed position;

an intrusion-detection switch mounted in a rear area of the drawer and configured to detect movement of the drawer between the open position and the closed position; and a pressing module mounted rearwardly of the drawer and including a main base fixed to the chassis, and a pressing unit attached to the main base and positioned rearwardly of the rear area of the drawer, the pressing unit having a first end fixedly attached to the main base, the pressing unit further having a second end free to translate linearly relative to the main base, the pressing unit further having a compression spring mounted between the first end and the second end for facilitating linear translation of the pressing unit, the pressing unit being in contact with the intrusion-detection switch when the drawer is in the closed position, the pressing unit translating linearly in response to movement of the drawer in the closed position along a predetermined tolerance distance.

16. The computing system of claim 15, wherein the pressing unit further has a secondary base fixedly coupled to the main base, the secondary base forming the first end.

17. The computing system of claim 16, wherein the pressing unit further has a cover movingly coupled to the secondary base, the cover forming the second end, the compression spring being mounted internal to the cover and overlapping a portion of the secondary base.

18. A method for detecting intrusion in a computing system, the method comprising:

providing, within a chassis, a drawer for receiving a plurality of computing storage devices;

configuring the drawer for movement between an open position and a closed position relative to the chassis, the drawer being partially inserted within the chassis in the open position, the drawer being fully inserted within the chassis in the closed position;

detecting movement of the drawer via physical contact between an intrusion-detection switch and a pressing module, the physical contact occurring in an initial contact position and continuing through a maximum contact position, the intrusion-detection switch being mounted in a rear area of the drawer and the pressing module being mounted to the chassis rearwardly of the rear area of the drawer; and in response to the physical contact, translating linearly a pressing unit of the pressing module along a predetermined tolerance distance of the drawer in the closed position, the predetermined tolerance distance being a maximum operating range of the drawer that is defined by the initial contact position and the maximum contact position.

19. The method of claim 18, further comprising moving the drawer in response to a user force during a maintenance operation.

20. The method of claim 18, further comprising exerting a spring compression force on the pressing unit, the spring compression force being opposite in direction to movement of the drawer towards the closed position.

* * * * *